United States Patent
Yang et al.

(10) Patent No.: US 12,185,525 B2
(45) Date of Patent: Dec. 31, 2024

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventors: Mengmeng Yang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 568 days.

(21) Appl. No.: 17/598,836

(22) PCT Filed: Jun. 22, 2021

(86) PCT No.: PCT/CN2021/101420
§ 371 (c)(1),
(2) Date: Sep. 27, 2021

(87) PCT Pub. No.: WO2022/142180
PCT Pub. Date: Jul. 7, 2022

(65) Prior Publication Data
US 2023/0053370 A1 Feb. 23, 2023

(30) Foreign Application Priority Data
Dec. 30, 2020 (CN) .......................... 202011631057.3

(51) Int. Cl.
| | |
|---|---|
| G11C 5/00 | (2006.01) |
| G11C 5/06 | (2006.01) |
| H10B 12/00 | (2023.01) |

(52) U.S. Cl.
CPC ........... *H10B 12/315* (2023.02); *G11C 5/063* (2013.01); *H10B 12/0335* (2023.02); *H10B 12/482* (2023.02); *H10B 12/488* (2023.02)

(58) Field of Classification Search
None
See application file for complete search history.

(56) References Cited

U.S. PATENT DOCUMENTS

| | | |
|---|---|---|
| 8,697,525 B2 | 4/2014 | Kim et al. |
| 9,230,612 B2 | 1/2016 | Park |

(Continued)

FOREIGN PATENT DOCUMENTS

| | | |
|---|---|---|
| CN | 102543944 A | 7/2012 |
| CN | 104900584 A | 9/2015 |

(Continued)

OTHER PUBLICATIONS

International Search Report as cited in PCT/CN2021/101420 mailed Sep. 29, 2021, 9 pages.

(Continued)

*Primary Examiner* — Bilkis Jahan
(74) *Attorney, Agent, or Firm* — Kilpatrick Townsend & Stockton LLP

(57) ABSTRACT

The present disclosure provides a method for manufacturing a semiconductor device and a semiconductor device. The method for manufacturing a semiconductor device includes: providing a substrate; forming a plurality of first structures extending in a first direction on the substrate; forming a sacrificial layer on sidewalls of the first structures; forming an outer spacer layer on a sidewall of the sacrificial layer; removing part of the outer spacer layer to obtain a patterned outer spacer layer that exposes part of the sacrificial layer; and removing the sacrificial layer to form air gaps between the patterned outer spacer layer and the first structures.

18 Claims, 10 Drawing Sheets

(56) References Cited

U.S. PATENT DOCUMENTS

| | | | |
|---|---|---|---|
| 9,337,203 B2 | 5/2016 | Hwang et al. | |
| 10,475,794 B1 | 11/2019 | Wu et al. | |
| 10,854,676 B2 | 12/2020 | Feng et al. | |
| 10,978,458 B2 | 4/2021 | Ji et al. | |
| 2013/0320550 A1 | 12/2013 | Kim | |
| 2014/0110816 A1* | 4/2014 | Kim | H10B 12/0335 257/499 |
| 2015/0061134 A1* | 3/2015 | Lee | H10B 12/34 257/751 |
| 2015/0187699 A1* | 7/2015 | Baek | H01L 23/5222 257/773 |
| 2015/0262625 A1 | 9/2015 | Han et al. | |
| 2016/0276349 A1 | 9/2016 | Kwon | |
| 2017/0076974 A1* | 3/2017 | Choi | H01L 23/528 |
| 2017/0323893 A1* | 11/2017 | Kim | H10B 12/033 |
| 2018/0122898 A1* | 5/2018 | Park | H01L 29/0649 |
| 2018/0166553 A1 | 6/2018 | Lee et al. | |
| 2018/0211964 A1* | 7/2018 | Feng | H10B 12/482 |
| 2018/0240888 A1 | 8/2018 | Oh | |
| 2018/0342521 A1* | 11/2018 | Son | H01L 21/76816 |
| 2019/0378843 A1 | 12/2019 | Yang et al. | |
| 2020/0020697 A1 | 1/2020 | Kim et al. | |
| 2020/0098886 A1 | 3/2020 | Liu et al. | |
| 2020/0203354 A1 | 6/2020 | Lee et al. | |
| 2020/0381481 A1* | 12/2020 | Hekmatshoartabari | H10B 63/84 |
| 2021/0249519 A1* | 8/2021 | Yao | H01L 29/66795 |
| 2022/0020758 A1* | 1/2022 | Park | H10B 12/0335 |

FOREIGN PATENT DOCUMENTS

| | | |
|---|---|---|
| CN | 103779352 B | 4/2018 |
| CN | 108346660 A | 7/2018 |
| CN | 110364529 A | 10/2019 |
| CN | 110581103 A | 12/2019 |
| CN | 111354711 A | 6/2020 |
| JP | 2008277826 A | 11/2008 |
| JP | 2014053612 A | 3/2014 |
| KR | 20140085654 A | 7/2014 |
| KR | 20150137224 A | 12/2015 |
| WO | 2019151043 A1 | 8/2019 |

OTHER PUBLICATIONS

Japanese Patent Office, Office Action Issued in Application No. 2023-529044, Jun. 25, 2024, 10 pages.
European Patent Office, the Extended European Search Report Issued in Application No. 21912937.6, Feb. 29, 2024, Germany, 11 pages.
Korean Intellectual Property Office, First Office Action Issued in Application No. 10-2023-7016541, Feb. 28, 2024, 16 pages.

* cited by examiner

S310 Form the sacrificial layer on exposed surfaces of the substrate and the first structures through a deposition process S320 Etch back the sacrificial layer to form the sacrificial layer on the sidewalls of the first structures

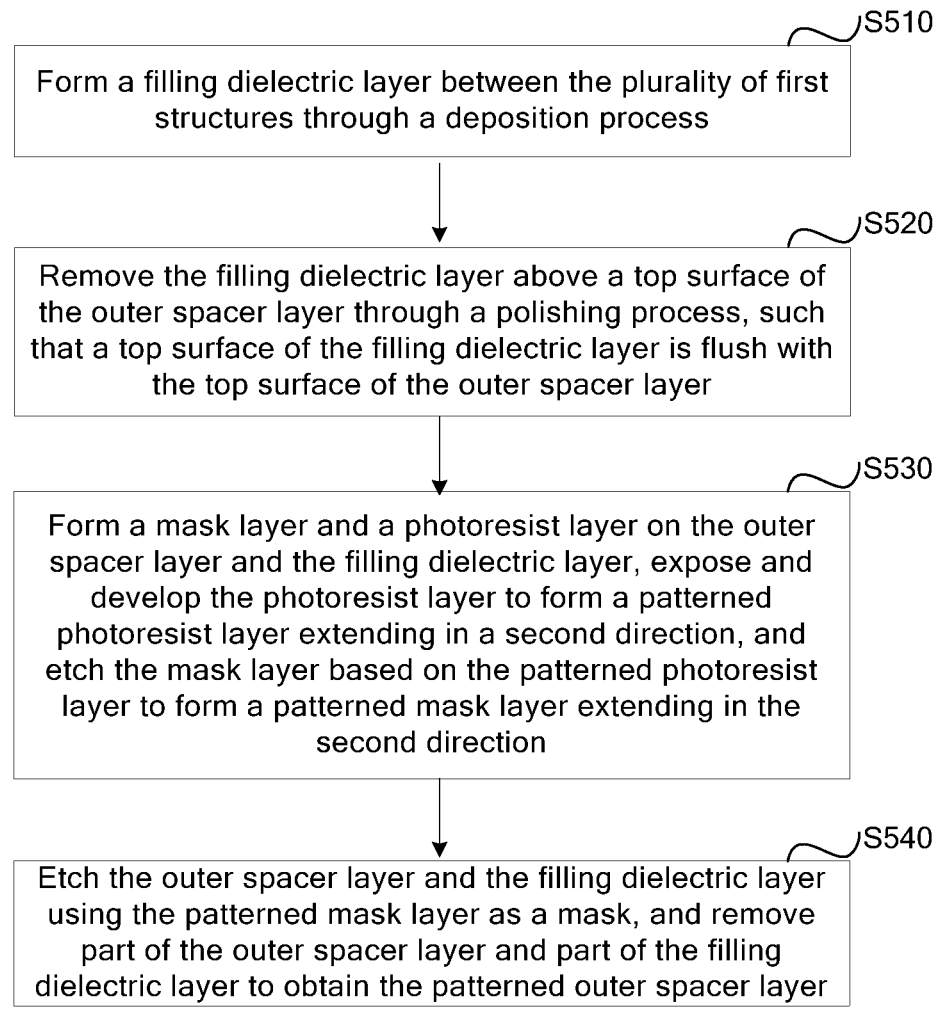

- S510 Form a filling dielectric layer between the plurality of first structures through a deposition process
- S520 Remove the filling dielectric layer above a top surface of the outer spacer layer through a polishing process, such that a top surface of the filling dielectric layer is flush with the top surface of the outer spacer layer
- S530 Form a mask layer and a photoresist layer on the outer spacer layer and the filling dielectric layer, expose and develop the photoresist layer to form a patterned photoresist layer extending in a second direction, and etch the mask layer based on the patterned photoresist layer to form a patterned mask layer extending in the second direction
- S540 Etch the outer spacer layer and the filling dielectric layer using the patterned mask layer as a mask, and remove part of the outer spacer layer and part of the filling dielectric layer to obtain the patterned outer spacer layer

FIG. 8

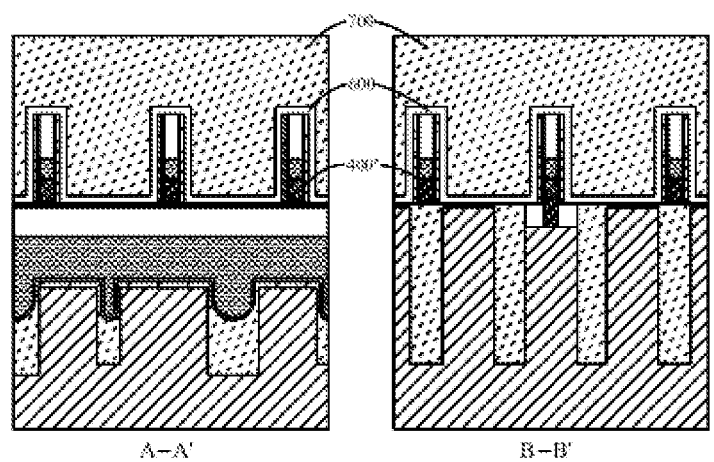

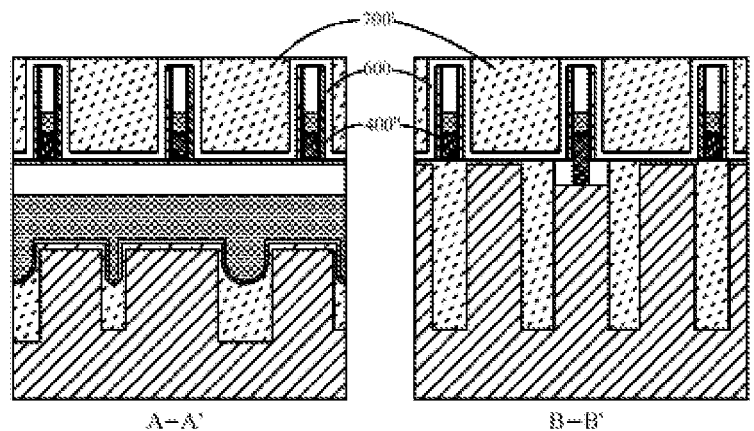
FIG. 9B
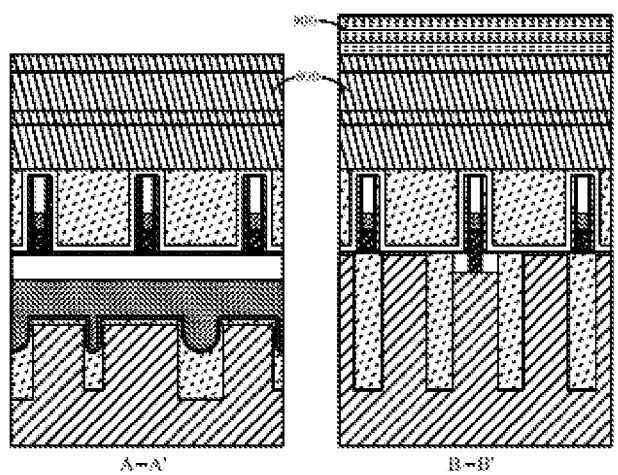
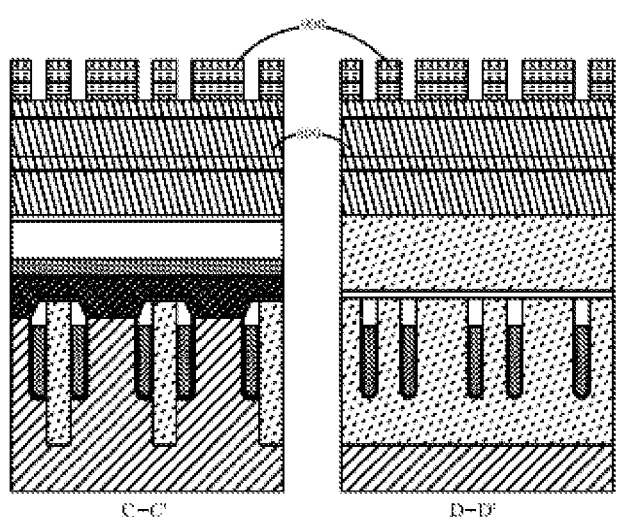
FIG. 10

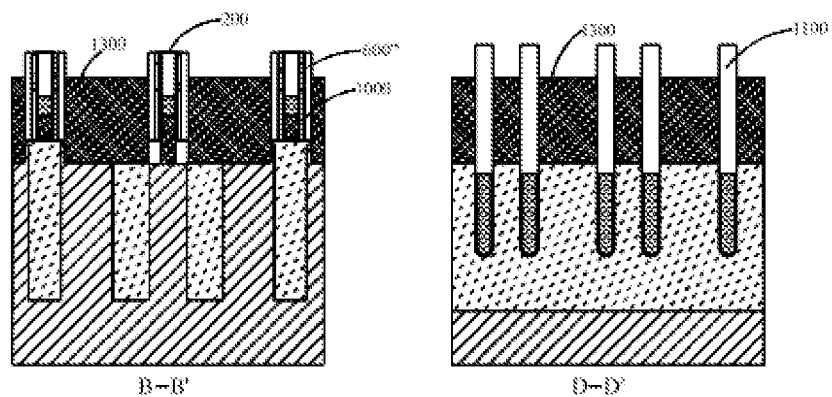
FIG. 14C
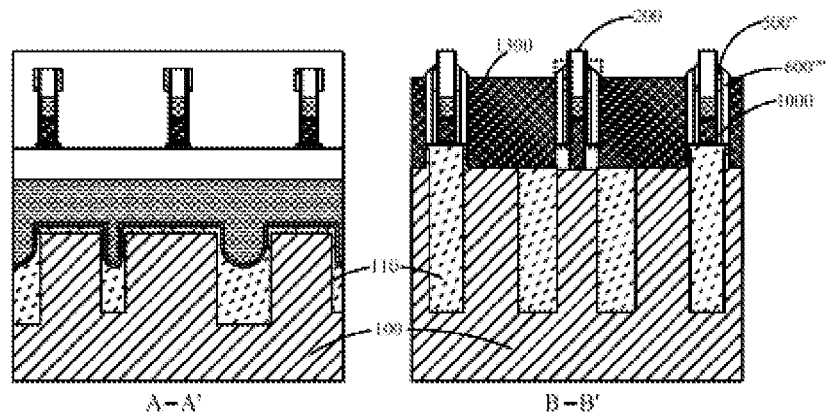
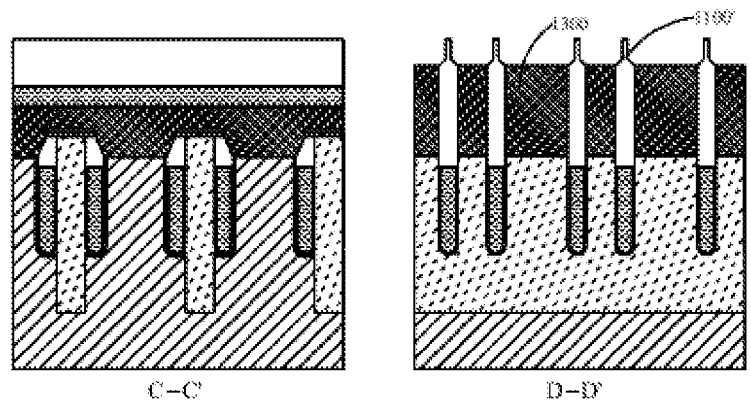
FIG. 15

METHOD FOR MANUFACTURING SEMICONDUCTOR DEVICE AND SEMICONDUCTOR DEVICE

CROSS-REFERENCE TO RELATED APPLICATIONS

The present disclosure claims the priority to Chinese Patent Application No. 202011631057.3, titled "METHOD FOR MANUFACTURING SEMICONDUCTOR DEVICE AND SEMICONDUCTOR DEVICE", filed with China National Intellectual Property Administration (CNIPA) on Dec. 30, 2020, which is incorporated herein by reference in its entirety.

TECHNICAL FIELD

The present disclosure relates to the technical field of semiconductors, in particular to a method for manufacturing a semiconductor device and a semiconductor device.

BACKGROUND

With the improvement in the integration level of the semiconductor device, the size of the structures in the semiconductor device is gradually reduced and the distribution density thereof is gradually increased. The increasing distribution density of the structures leads to the reducing spacing between the structures, making it more likely to cause dielectric breakdown or parasitic capacitance for the conductive structures. Therefore, the effective electrical isolation of adjacent conductive structures has become a focus of the current manufacturing process of the semiconductor device.

At present, air spacer layers are usually formed on two sidewalls of the conductive structure to reduce the parasitic capacitance between adjacent structures, so as to improve the electrical isolation effect. Specifically, during the manufacturing process of the semiconductor device, a sacrificial layer is generally formed on the sidewall of the conductive structure, and a high-selectivity dry cleaning machine is used to etch the sacrificial layer to form the air spacer layer. The width of the required air spacer layer is very small, usually no more than 5 nm. In the actual manufacturing process, it is hard to completely remove such a narrow sacrificial layer by etching, and the etching of the etching agent on the sacrificial layer is not uniform. As a result, the air spacer layer formed has poor surface uniformity, which reduces the electrical isolation effect of the air spacer layer, thereby affecting the electrical performance of the semiconductor device.

SUMMARY

The embodiments of the present disclosure provide a method for manufacturing a semiconductor device.

The method for manufacturing a semiconductor device includes:
  providing a substrate;
  forming a plurality of first structures extending in a first direction on the substrate;
  forming a sacrificial layer on sidewalls of the first structures;
  forming an outer spacer layer on a sidewall of the sacrificial layer;
  removing part of the outer spacer layer to obtain a patterned outer spacer layer that exposes part of the sacrificial layer; and
  removing the sacrificial layer to form air gaps between the patterned outer spacer layer and the first structures.

The present disclosure further provides a semiconductor device. The semiconductor device includes:
  a substrate;
  a plurality of first structures formed on the substrate and extending in a first direction; and
  a patterned outer spacer layer formed on partial regions on two sidewalls of the first structures, where air gaps are formed between the patterned outer spacer layer and the first structures;
  where, the patterned outer spacer layer includes a plurality of outer spacer blocks; the plurality of outer spacer blocks are distributed on the substrate at intervals in the first direction.

BRIEF DESCRIPTION OF THE DRAWINGS

FIG. 8 is a flowchart of forming a patterned outer spacer layer according to an embodiment.

FIG. 9A provides cross-sectional views taken along lines A-A' and B-B' in FIG. 2 after deposition of a filling dielectric layer.

FIG. 9B provides cross-sectional views taken along lines A-A' and B-B' in FIG. 2 after etch-back of the filling dielectric layer.

FIG. 10 provides cross-sectional views taken along lines A-A', B-B', C-C' and D-D' in FIG. 2 after formation of a mask layer and a patterned photoresist layer.

FIG. 14C provides cross-sectional views taken along lines B-B' and D-D' in FIG. 2 after formation of storage node contact structures.

FIG. 15 provides cross-sectional views taken along lines A-A', B-B', C-C' and D-D' in FIG. 2 after etching of the patterned outer spacer layer.

DETAILED DESCRIPTION

Figure 1:
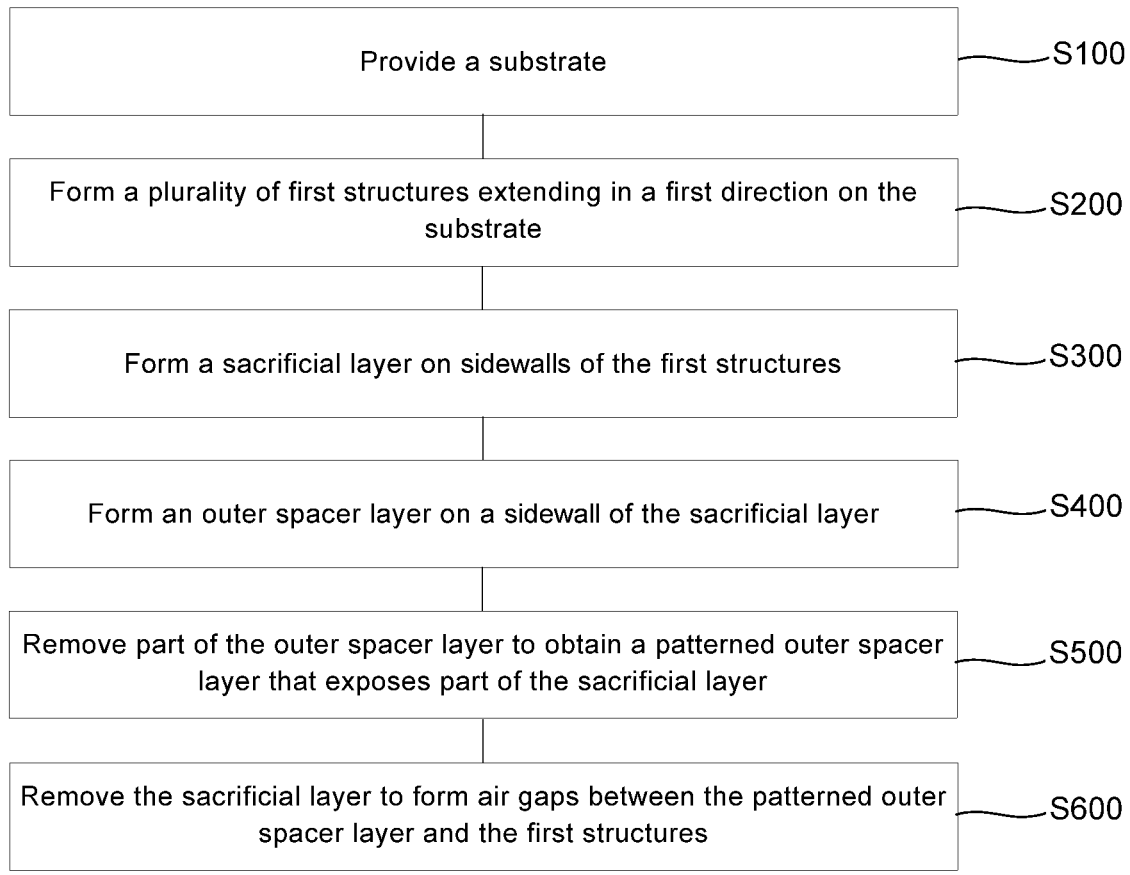
FIG. 1 is a flowchart of a method for manufacturing a semiconductor device according to an embodiment.

In order to facilitate the understanding of the present disclosure, the present disclosure is described more completely below with reference to the accompanying drawings. The accompanying drawings show the preferred implementations of the present disclosure. The present closure is embodied in various forms without being limited to the embodiments set forth herein. On the contrary, these embodiments are provided for a more thorough and comprehensive understanding of the present disclosure.

It should be noted that when a component is fixed with the other component, the component may be fixed with the other component directly or via an intermediate component. When a component is connected with the other component, the component may be connected with the other component directly or via an intermediate component. The terms "vertical", "horizontal", "left", "right", "upper", "lower", "front", "rear", "peripheral" and similar expressions used herein are described based on the orientations or positions shown in the accompanying drawings. These terms are merely intended to facilitate and simplify the description of the present disclosure, rather than to indicate or imply that the mentioned device or component must have a specific orientation or must be constructed and operated in a specific orientation. Therefore, these terms should not be understood as a limitation to the present disclosure.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure. The term "and/or" used herein includes any and all combinations of one or more of the associated listed items.

An air gap can be formed between a bit line and a storage node contact structure to strengthen the insulation effect between the bit line and the storage node contact structure. The process of forming the air gap using the traditional technology includes: form a conductive structure to be isolated; form an inner dielectric layer, a sacrificial layer and an outer dielectric layer sequentially outwards on a sidewall of the conductive structure; form polysilicon in contact with the outer dielectric layer; and finally remove the sacrificial layer by using a high-selectivity etching agent to form an air gap separating the conductive structure and the polysilicon. Since the width of the required air gap is very small, the width of the corresponding sacrificial layer is also very small, usually no more than 5 nm. In the actual manufacturing process, it is hard to completely remove such a narrow sacrificial layer by etching, and the etching of the etching agent on the sacrificial layer is not uniform, such that the surrounding surface forming the air gap is not uniform. As a result, the electrical isolation effect of the air gap is reduced, thereby affecting the electrical performance of the semiconductor device.

In order to overcome the above shortcomings, the present disclosure provides an improved manufacturing method of a semiconductor device and a semiconductor device. In the present disclosure, part of a sacrificial layer is exposed to make the sacrificial layer contact and react with the outside, so as to completely remove the sacrificial layer. In this way, the original etching method can be replaced, thereby avoiding the problems that it is hard to remove the narrow sacrificial layer by using the traditional technology and the etching causes poor surface uniformity around the air gap.

Specifically, as shown in FIG. 1, in an embodiment of the present disclosure, the improved manufacturing method of a semiconductor device includes:

S100: Provide a substrate.

The substrate may include a monocrystalline silicon substrate, a silicon-on-insulator (SOI) substrate, a stacked silicon-on-insulator (SSOI) substrate, a stacked silicon-germanium-on-insulator (S—SiGeOI) substrate, a silicon-germanium-on-insulator (SiGeOI) substrate or a germanium-on-insulator (GeOI) substrate, etc. In the embodiments of the present disclosure, the substrate includes a monocrystalline silicon substrate.

Figure 2:
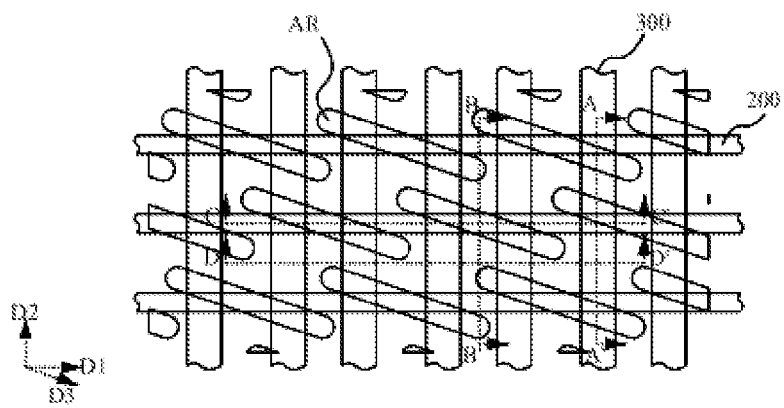
FIG. 2 is a top view of the semiconductor device after formation of a first structure according to an embodiment.
Figure 3:
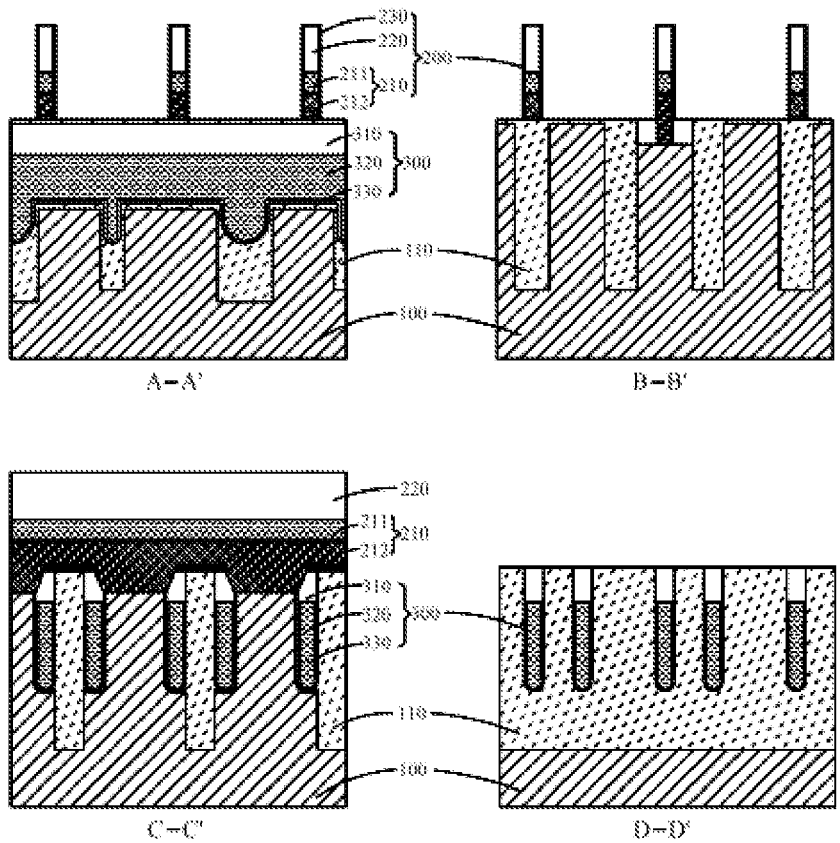
FIG. 3 provides cross-sectional views taken along lines A-A', B-B', C-C' and D-D' in FIG. 2, showing an implementation of the semiconductor device after formation of the first structure.

Further, referring to FIGS. 2 and 3, a trench isolation structure 110 may be provided in a substrate 100 to define a plurality of active regions (AR) in the substrate 100, and the plurality of ARs may be arranged in a staggered array. Specifically, the trench isolation structure 110 includes silicon oxide. Each AR may present a pillar shape extending in a third direction D3, and the ARs may be arranged parallel to each other. The center of one AR may be adjacent to an end part of another adjacent AR.

S200: Form a plurality of first structures extending in a first direction on the substrate.

Referring to FIGS. 2 and 3, a plurality of first structures 200 extending in a first direction D1 are formed on the substrate 100. Specifically, each of the first structures 200 may include a conductive structure 210 and an isolation sidewall 230 located on a sidewall of the conductive structure 210. The conductive structure 210 may include a bit line 211 extending in the first direction D1. Further, the conductive structure 210 may include a bit line plug 212 and a bit line 211 which are stacked. The bit line plug 212 is located between the bit line 211 and the substrate 100. The isolation sidewall 230 includes silicon nitride, and may also include other dielectric material. The bit line plug 212 includes an epitaxial structure. The bit line 211 includes tungsten, and may also include aluminum, copper, nickel or cobalt. In an embodiment, a barrier layer is provided between the bit line 211 and the bit line plug 212, and the barrier layer includes titanium nitride. In an embodiment, a bit line protection structure 220 is formed on the bit line 211, and the bit line protection structure 220 includes silicon nitride.

In an embodiment, a plurality of second structures 300 extending in a second direction D2 may be formed in the substrate 100. The second direction D2 crosses the first direction D1. Optionally, the second direction D2 is perpendicular to the first direction D1. Specifically, each of the second structures 300 may include a buried word line 320 extending in the second direction D2. A top surface of the buried word line 320 is lower than a top surface of the substrate 100, and a word line protection structure 310 extending from the buried word line 320 to the top surface of the substrate 100 is formed on the buried word line 320. The buried word line 320 includes tungsten, and the word line protection structure 310 includes silicon nitride, silicon oxide or silicon oxynitride, etc. Further, a gate oxide layer 330 is provided between the buried word line 320 and the substrate 100. The gate oxide layer 330 includes silicon dioxide. A barrier layer may further be formed between the gate oxide layer 330 and the buried word line 320. The barrier layer includes titanium nitride.

Step 300: Form a sacrificial layer on sidewalls of the first structures.

Figure 4:
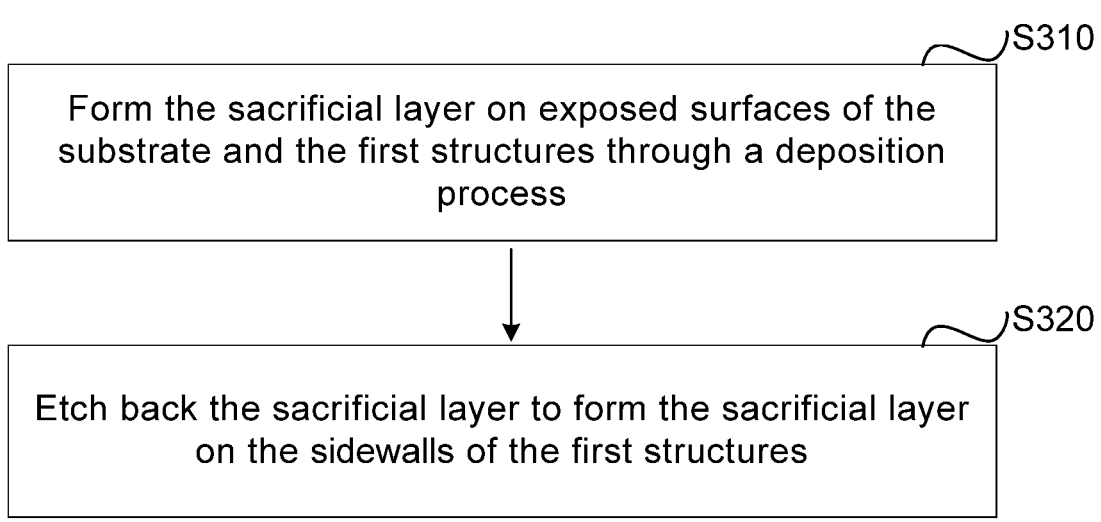
FIG. 4 is a flowchart of forming a sacrificial layer according to an embodiment.
Figure 11:
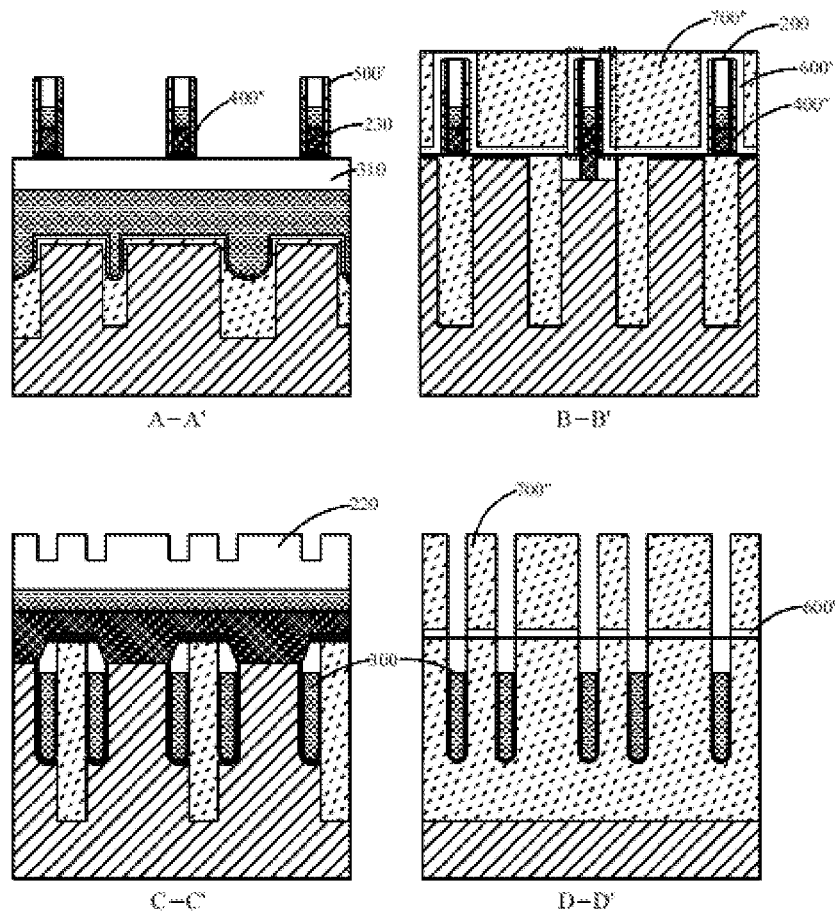
FIG. 11 provides cross-sectional views taken along lines A-A', B-B', C-C' and D-D' in FIG. 2 after formation of the patterned outer spacer layer.

Referring to FIG. 11, the last removed sacrificial layer is located on two sidewalls of each first structure 200 extending in the first direction D1, and a top surface of the sacrificial layer is not lower than top surfaces of the conductive structures 210. In this way, air gaps formed after the sacrificial layer is removed achieve a desirable electrical isolation effect between the conductive structures 210 and a storage node contact structure formed subsequently. Specifically, as shown in FIG. 4, step S300 may include:

S310: Form a sacrificial layer on exposed surfaces of the substrate and the first structures through a deposition process.

S320: Etch back the sacrificial layer to form a sacrificial layer on sidewalls of the first structures.

Figure 5:
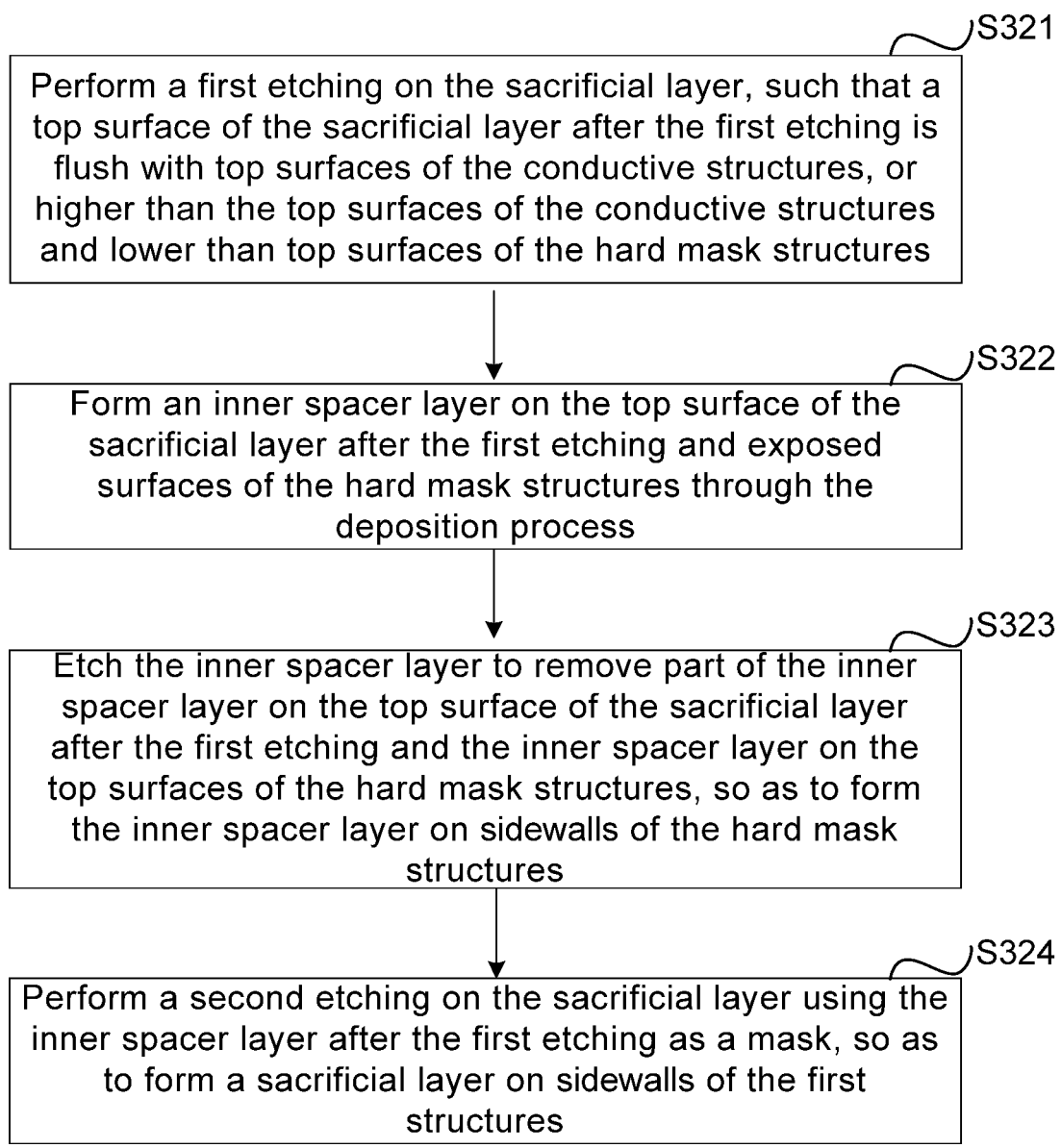
FIG. 5 is a flowchart of etching back the sacrificial layer according to an embodiment.

As shown in FIGS. 6A to 6D, a complete sacrificial layer 400 is deposited on the exposed surfaces of the substrate 100 and the first structures 200 through a deposition process, and then the sacrificial layer 400 is etched back to remove part of the sacrificial layer 400 on the substrate 100, thereby forming a sacrificial layer 400" on sidewalls of the first structures 200. Further, under the same etching conditions, the sacrificial layer 400 may be made of a material with a larger etching selectivity than that of the first structures, so as to facilitate the complete removal of the sacrificial layer later. The deposition process includes chemical vapor deposition (CVD) or atomic layer deposition (ALD). In the embodiments of the present disclosure, the ALD process is used. Specifically, as shown in FIG. 5, step S320 may include:

S321: Perform a first etching on the sacrificial layer, such that a top surface of the sacrificial layer after the first etching is flush with top surfaces of the conductive structures, or higher than the top surfaces of the conductive structures and lower than top surfaces of the hard mask structures.

Figure 6A:
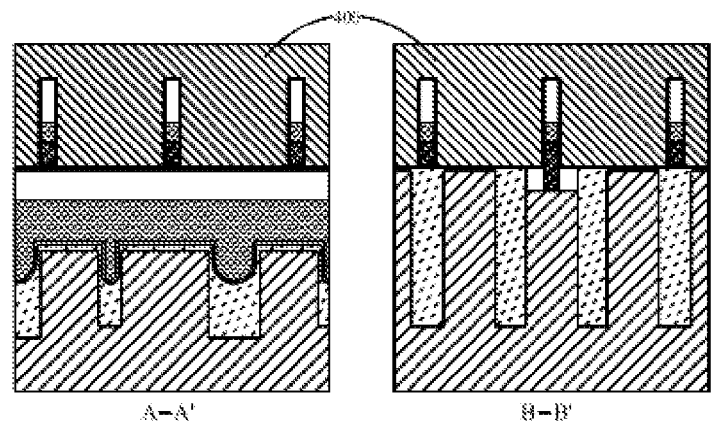
FIG. 6A provides cross-sectional views taken along lines A-A' and B-B' in FIG. 2 after deposition of the sacrificial layer.
Figure 6B:
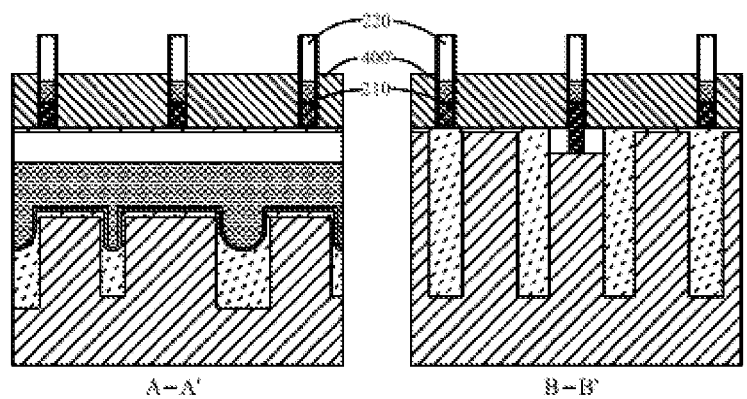
FIG. 6B provides cross-sectional views taken along lines A-A' and B-B' in FIG. 2 after first etching of the sacrificial layer.

As shown in FIG. 6B, the hard mask structures are located above the conductive structures 210, and the hard mask structures may be made of the same material as the bit line protection structures 220. In an embodiment, the bit line protection structures 220 may also include hard mask structures. By performing a first etching on the sacrificial layer 400, a sacrificial layer 400' may be obtained, and a top surface of the sacrificial layer 400' is not lower than top surfaces of the conductive structures 210.

S322: Form an inner spacer layer on the top surface of the sacrificial layer after the first etching and exposed surfaces of the hard mask structures through a deposition process.

S323: Etch the inner spacer layer to remove part of the inner spacer layer on the top surface of the sacrificial layer after the first etching and the inner spacer layer on the top surfaces of the hard mask structures, so as to form an inner spacer layer on sidewalls of the hard mask structures.

Figure 6C:
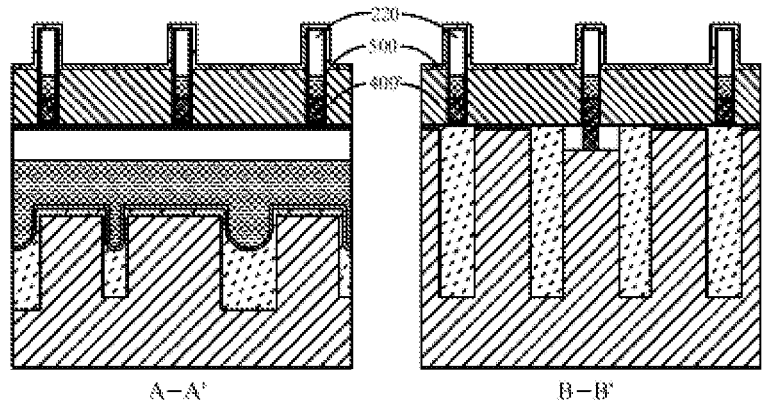
FIG. 6C provides cross-sectional views taken along lines A-A' and B-B' in FIG. 2 after deposition of an inner spacer layer.

As shown in FIG. 6C, an inner spacer layer 500 with the same thickness may be deposited on a top surface of the sacrificial layer 400' and exposed surfaces of the hard mask structures through a deposition process. The inner spacer layer 500 conformally covers the exposed surfaces of the sacrificial layer 400' and the hard mask structures. By etching the inner spacer layer 500 downward, part of the inner spacer layer 500 on the top surface of the sacrificial layer 400' and the inner spacer layer 500 on the top surfaces of the hard mask structures are removed, and the inner spacer layer 500 on the sidewalls of the hard mask structures is retained, thereby obtaining an inner spacer layer 500'.

S324: Perform a second etching on the sacrificial layer using the inner spacer layer after the first etching as a mask, so as to form a sacrificial layer on sidewalls of the first structures.

Figure 6D:
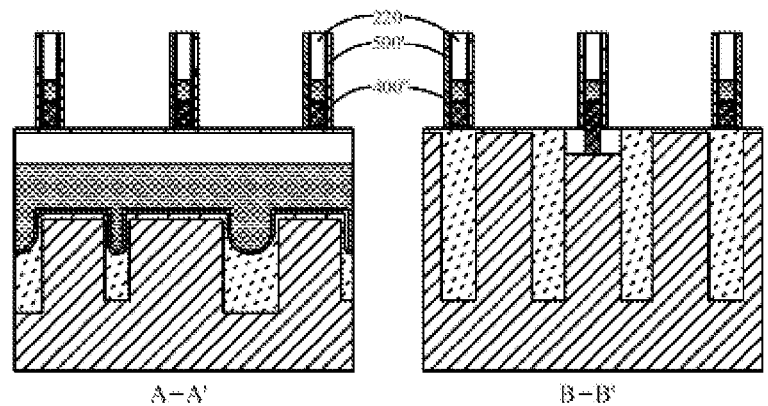
FIG. 6D provides cross-sectional views taken along lines A-A' and B-B' in FIG. 2 after second etching of the sacrificial layer and etching of the inner spacer layer.

As shown in FIG. 6D, a second etching is performed on the sacrificial layer 400' using the inner spacer layer 500' as a mask. Part of the sacrificial layer 400' on the substrate 100 is removed, and the sacrificial layer 400' on the sidewalls of the first structures 200 (that is, the sidewalls of the isolation sidewalls 230 away from the conductive structures 210) is retained, thereby obtaining a sacrificial layer 400". The sacrificial layer 400" needs to be removed later to form air gaps.

The inner spacer layer 500' is provided above the sacrificial layer 400" to facilitate the etching of the sacrificial layer 400' and to well seal the subsequently formed air gaps, thereby improving the electrical isolation effect between the conductive structures 210 and a storage node contact structure formed later. It should be understood that, in some implementations, the inner spacer layer 500' may not be provided above the sacrificial layer 400". Instead, the sacrificial layer 400" is directly provided in a region where the inner spacer layer 500' is located. In this way, when the first etching is performed on the sacrificial layer 400, the sacrificial layer to be removed is formed on two sidewalls of the first structures 200 through a corresponding mask, so as to simplify the step of forming the air gaps, thereby improving the manufacturing efficiency of the semiconductor device.

S400: Form an outer spacer layer on a sidewall of the sacrificial layer.

Figure 7:
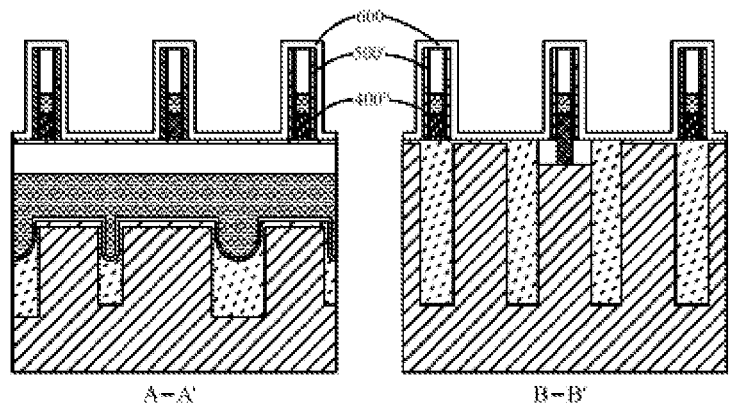
FIG. 7 provides cross-sectional views taken along lines A-A' and B-B' in FIG. 2 after deposition of an outer spacer layer.

Referring to FIG. 7, an outer spacer layer 600 with the same thickness may be deposited on the exposed surfaces of the substrate 100, the sacrificial layer 400" and the first structures 200, respectively. The sidewall of the sacrificial layer 400" is also covered by the outer spacer layer 600. It should be noted that the outer spacer layer 600 on the top surfaces of the first structures 200 and on the substrate 100 may be removed by etching through a mask, or by etching in a subsequent process of the manufacturing method of the present disclosure. In this embodiment, the outer spacer layer is removed by etching in a subsequent process, so as to omit mask preparation and simplify the manufacturing process of the outer spacer layer on the sidewall of the sacrificial layer 400".

S500: Remove part of the outer spacer layer to obtain a patterned outer spacer layer that exposes part of the sacrificial layer.

Referring to FIG. 11, by etching the outer spacer layer 600, an outer spacer layer 600' is obtained, and a patterned outer spacer layer is formed. The patterned outer spacer layer is shown by a thick dashed box in FIG. 11. Further, for example, as shown in the A-A' and B-B' cross-sectional views in FIG. 11, the patterned outer spacer layer may be formed in partial regions on two sidewalls of the first structures 200, and at least the outer spacer layer directly above the second structures 300 is removed, such that at least the sacrificial layer 400" directly above the second structures 300 is exposed. Specifically, as shown in FIG. 8, step S500 may include:

S510: Form a filling dielectric layer between the plurality of first structures through a deposition process.

S520: Remove the filling dielectric layer above a top surface of the outer spacer layer through a polishing process, such that a top surface of the filling dielectric layer is flush with the top surface of the outer spacer layer.

Referring to FIGS. 9A and 9B, a complete filling dielectric layer 700 may be deposited on the outer spacer layer 600 through a deposition process, such that the filling dielectric layer 700 fills regions between the plurality of first structures 200. Then, the filling dielectric layer 700 above the top surface of the outer spacer layer 600 is removed through a polishing process to form a filling dielectric layer 700', where a top surface of the filling dielectric layer 700' is flush with the top surface of the outer spacer layer 600. In this way, it is convenient to subsequently etch the outer spacer layer 600 and the filling dielectric layer 700' through a mask or a mask layer.

S530: Form a mask layer and a photoresist layer on the outer spacer layer and the filling dielectric layer, expose and develop the photoresist layer to form a patterned photoresist layer extending in a second direction, and etch the mask layer based on the patterned photoresist layer to form a patterned mask layer extending in the second direction.

S540: Etch the outer spacer layer and the filling dielectric layer using the patterned mask layer as a mask, and remove part of the outer spacer layer and part of the filling dielectric layer to obtain the patterned outer spacer layer.

Referring to FIG. 10, a mask layer 800 is provided on the outer spacer layer 600 and the filling dielectric layer 700', and an etching window is defined by the mask layer 800. The mask layer 800 can be a single layer or multiple layers, and different selections can be made according to process requirements. In this embodiment, there are four stacked mask layers 800, specifically first, second, third and fourth mask layers sequentially stacked on the outer spacer layer 600 and the filling dielectric layer 700'. Further, a patterned photoresist layer 900 extending in the second direction D2 is further formed on the fourth mask layer. The patterned photoresist layer 900 defines an etching window for the fourth mask layer, and then the fourth, third, second and first mask layers are etched in sequence. The etching window is moved down to the first mask layer to expose the outer spacer layer 600 and the filling dielectric layer 700' to be etched, and then the outer spacer layer 600 and the filling dielectric layer 700' are etched. After the etching is completed, as shown in FIG. 11, at least the outer spacer layer 600 and the filling dielectric layer 700' directly above the second structures 300 are removed, and an outer spacer layer 600' and a filling dielectric layer 700" are formed. The outer spacer layer 600' has a plurality of gaps in the first direction D1. In this way, at least the sacrificial layer 400" directly above the second structures 300 is exposed.

S600: Remove the sacrificial layer to form air gaps between the patterned outer spacer layer and the first structures.

Figure 12:
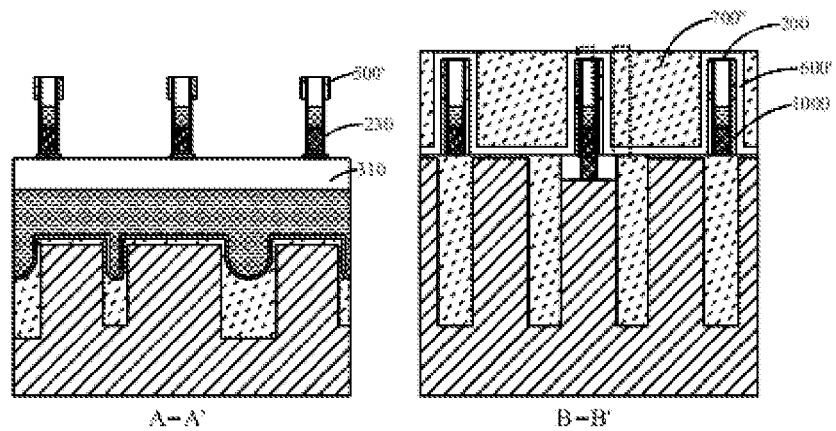
FIG. 12 provides cross-sectional views taken along lines A-A' and B-B' in FIG. 2 after removal of the sacrificial layer.

The sacrificial layer 400" may include a hydrocarbon layer or a polymer layer that can be thermally decomposed, and such a sacrificial layer 400" may be selectively removed through an ashing process or application of heat. Specifically, oxygen may be introduced into the substrate 100. During the ashing process, the oxygen may contact and react with the exposed sacrificial layer 400", such that the sacrificial layer 400" is converted into carbon dioxide gas, carbon monoxide gas and/or methane gas. These gases may be quickly exported to the outside during the reaction without being too much blocked by other structures or staying in the reaction space for a long time. After the ashing process is completed, as shown in FIG. 12, the sacrificial layer 400" is completely removed, and air gaps 1000 are formed between the patterned outer spacer layer and the first structures 200.

In the manufacturing method, the sacrificial layer 400" is first formed on sidewalls of the first structures 200 on the substrate 100, the outer spacer layer is formed on a sidewall of the sacrificial layer 400", part of the outer spacer layer is formed to obtain a patterned outer spacer layer that exposes part of the sacrificial layer, and the sacrificial layer is removed to form air gaps between the patterned outer spacer layer and the first structures 200. The present disclosure exposes part of the sacrificial layer 400" such that the sacrificial layer 400" directly reacts with the outside to be completely removed, thereby forming air gaps 1000 with small widths. In this way, the present disclosure solves the problem that it is hard to remove the narrow sacrificial layer 400" by using the traditional technology. Meanwhile, since there is no need to remove the sacrificial layer 400" by etching, the surface uniformity around the air gap 1000 is improved.

In an embodiment, after forming the air gaps 1000, the method further includes:

S600: Form a plurality of storage node contact structures between the plurality of first structures, where the storage node contact structures are in contact with the substrate; the air gaps are located between the storage node contact structures and the first structures.

Specifically, referring to FIG. 14C, a source region and a drain region are formed in the AR on two sidewalls of the buried word line 320, thereby forming a metal-oxide-semiconductor field-effect transistor (MOSFET). Further, the drain region is electrically connected with the bit line 211 through the bit line plug 212. A storage capacitor is formed above the source region. A bottom plate of the storage capacitor is electrically connected with the source region through the polysilicon, thereby forming a semiconductor memory, such as a dynamic random access memory (DRAM). Of course, other type of memory may also be formed. Therefore, the air gaps 1000 are located between the storage node contact structures and the first structures 200, which improves the insulation effect between the storage node contact structures and the first structures 200, thereby improving the electrical performance of the semiconductor memory. Specifically, step S600 may include:

S610: Form a node spacer layer in the filling dielectric layers through a deposition process, the node spacer layer covering the top surface of the filling dielectric layer.

S620: Etch back the node spacer layer such that a top surface of the node spacer layer is flush with the top surface of the filling dielectric layer.

Figure 13:
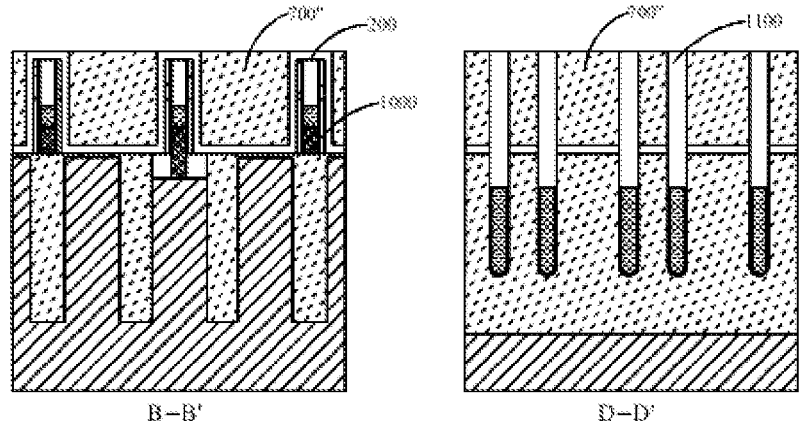
FIG. 13 provides cross-sectional views taken along lines B-B' and D-D' in FIG. 2 after formation of a node spacer layer.

Referring to FIG. 13, a complete node spacer layer may be deposited between the filling dielectric layers 700" through a deposition process. The node spacer layer is etched back to form a node spacer layer 1100. A top surface of the node spacer layer 1100 is flush with the top surface of the filling dielectric layer 700". It facilitates the definition of a formation region for the storage node contact structure and the isolation of adjacent storage node contact structures. Further, the node spacer layer 1100 is formed directly above the second structures 300.

S630: Remove the filling dielectric layer.

Figure 14A:
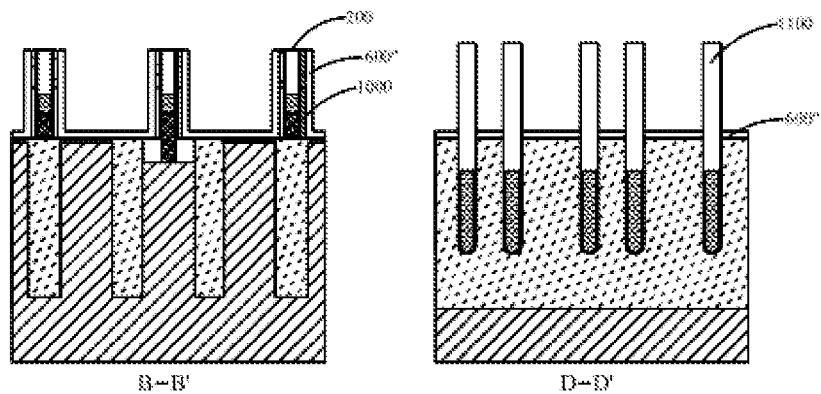
FIG. 14A provides cross-sectional views taken along lines B-B' and D-D' in FIG. 2 after removal of the filling dielectric layer.

Referring to FIG. 14A, the filling dielectric layer 700" may be removed by etching to provide a formation region for the storage node contact structure. In addition, while the filling dielectric layer 700" is etched, the outer spacer layer 600' on the top surfaces of the first structures 200 may also be etched to form an outer spacer layer 600".

S640: Etch part of the substrate to form a plurality of recessed substrate contact holes between adjacent first structures.

Figure 14B:
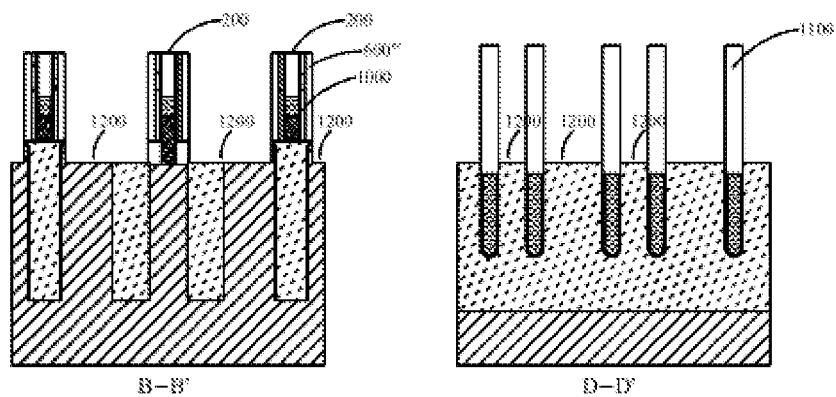
FIG. 14B provides cross-sectional views taken along lines B-B' and D-D' in FIG. 2 after formation of substrate contact holes.

Referring to FIG. 14B, part of the substrate 100 may be removed by etching to form a plurality of recessed substrate contact holes 1200 between adjacent first structures 200. The bottom plates of the storage capacitor above the source regions are electrically connected with the source regions in the substrate 100 through the substrate contact holes 1200. Further, the substrate contact holes 1200 are also located between adjacent second structures 300. In addition, while the substrate 100 is etched, the outer spacer layer 600" between the filling dielectric layer 700" and the substrate 100 may also be removed together to form an outer spacer layer 600''' on two sidewalls of the first structures 200. The outer spacer layer 600" is the above patterned outer spacer layer.

S650: Form an epitaxial layer on the substrate through an epitaxial process, where the epitaxial layer at least fills up the substrate contact holes.

S660: Etch back the epitaxial layer to form the plurality of storage node contact structures, where top surfaces of the storage node contact structures are lower than top surfaces of the first structures.

Referring to FIG. 14C, a complete epitaxial layer may be deposited on the substrate 100 through a deposition process, and the epitaxial layer at least fills the substrate contact holes 1200. Then, the epitaxial layer is etched back to form an epitaxial layer 1300, which forms the plurality of storage node contact structures together with the substrate contact holes 1200. Further, the top surfaces of the storage node contact structures are lower than these of the first structures 200, which helps the storage node contact structures contact the bottom plates of the storage capacitor.

In an embodiment, after step S660, the method further includes:

S670: Etch the patterned outer spacer layer to turn a top surface of the patterned outer spacer layer into an inclined surface.

Referring to FIG. 15, the top surface of the patterned outer spacer layer (shown in the thick dashed box) on the two sidewalls of the first structures 200 may be etched to form an outer spacer layer 600'''. After etching, the top surface of the patterned outer spacer layer is an inclined surface. As shown in the B-B' cross-sectional view, the top surface of the outer spacer layer 600''' on the two sidewalls of the first structures 200 are distributed in a splayed pattern. Meanwhile, the top surface of the node spacer layer 1100 is etched correspondingly to form a node spacer layer 1100'. In this way, the upper parts of the storage node contact structures are widened, thereby increasing the contact area between the storage node contact structures and the subsequent storage capacitor, and improving the performance of the semiconductor storage device.

In one embodiment, when an inner spacer layer 500' is further provided between the patterned outer spacer layer and the first structures 200, the inner spacer layer 500' also needs to be etched to form an inner spacer layer 500". A top surface of the inner spacer layer 500" is also distributed in a splayed pattern, as shown in the B-B' cross-sectional view. The top surface of the inner spacer layer 500" is also an inclined surface, so as to further increase the contact area between the storage node contact structures and the subsequent storage capacitor. It is understandable that other etching methods may also be used to increase the contact area between the storage node contact structures and the subsequent storage capacitor, which is not limited herein.

The present disclosure further provides a semiconductor structure.

As shown in FIG. 15, the semiconductor structure includes: a substrate 100, a plurality of first structures 200 formed on the substrate 100 and extending in a first direction D1, and a patterned outer spacer layer formed in partial regions on two sidewalls of the first structures 200 (shown in the thick dashed box). Air gaps are formed between the patterned outer spacer layer and the first structures 200. The patterned outer spacer layer includes a plurality of outer spacer blocks (not shown in the figure). The plurality of outer spacer blocks are distributed on the substrate 100 at intervals in the first direction.

Specifically, according to the above steps, the patterned outer spacer layer has a plurality of gaps in the first direction D1, such that the patterned outer spacer layer includes a plurality of outer spacer blocks distributed at intervals in the first direction D1.

In the semiconductor device, a patterned outer spacer layer is formed in partial regions on two sidewalls of the first structures 200. Air gaps are formed between the patterned outer spacer layer and the first structures 200, and the patterned outer spacer layer includes a plurality of outer spacer blocks distributed on the substrate 100 at intervals in the first direction D1. The semiconductor device achieves desirable surface uniformity around the air gap 1000, and avoids the problem of non-uniform electrical isolation due to poor etching uniformity, thereby improving the electrical isolation effect between the first structures and the adjacent storage node contact structures.

In an embodiment, referring to FIG. 15, the semiconductor device further includes a plurality of storage node contact structures formed between the plurality of first structures 200. The storage node contact structures are in contact with the substrate 100. The air gaps 1000 are located between the storage node contact structures and the first structures 200. Specifically, an epitaxial layer 1300 is filled in substrate contact holes 1200, and a top surface of the epitaxial layer is lower than top surfaces of the first structures 200, thereby forming storage node contact structures.

A source region and a drain region are formed in an AR on two sidewalls of a buried word line 320, thereby forming an MOSFET. The drain region is electrically connected with a bit line 211 through a bit line plug 212. A storage capacitor is formed above the source region. A bottom plate of the storage capacitor is electrically connected with the source region through polysilicon, thereby forming a semiconductor memory, such as a DRAM. Therefore, the air gaps 1000 are located between the storage node contact structures and the first structures 200, which improves the insulation effect between the storage node contact structures and the first structures 200, thereby improving the electrical performance of the semiconductor memory.

In an embodiment, a top surface of the patterned outer spacer layer is an inclined surface. Referring to FIG. 15, when the top surface of the patterned outer spacer layer is an inclined surface, an outer spacer layer 600"" is formed. Thus, the upper parts of the storage node contact structures are widened, thereby increasing the contact area between the storage node contact structures and the subsequently formed storage capacitor, and improving the performance of the semiconductor storage device.

In an embodiment, the semiconductor structure may be a DRAM. The first structures 200 include conductive structures 210 and isolation sidewalls 230 located on sidewalls of the conductive structures 210. The air gaps 1000 are formed between the isolation sidewalls 230 and the patterned outer spacer layer. Further, the conductive structures 210 include bit lines 211 extending in the first direction D1, and bit line protection structures 220 are formed on the bit lines 211. In an embodiment, the semiconductor device further includes a plurality of second structures 300 formed in the substrate 100 and extending in a second direction D2. The second structures 300 include buried word lines 320 extending in the second direction D2 and word line protection structures 310 formed on the buried word lines 320.

In an embodiment, an inner spacer layer 500" is further provided between the patterned outer spacer layer and the first structures. The air gaps 1000 are located between the inner spacer layer 500" and the substrate 100, and a bottom surface of the inner spacer layer 500" is not lower than top surfaces of the conductive structures 210. The inner spacer layer 500" is provided above air gaps 1000' to well seal the air gaps 1000, thereby improving the electrical isolation effect between the conductive structures 210 and the storage node contact structures, and increasing the contact area between the storage node contact structures and the subsequently formed storage capacitor.

The technical features of the above embodiments can be employed in arbitrary combinations. In an effort to provide a concise description of these embodiments, all possible combinations of all technical features of the embodiments may not be described. However, these combinations of technical features should be construed as the scope disclosed in the description as long as no contradiction occurs.

Several embodiments of the present disclosure are merely described more in detail above, but they should not therefore be construed as limiting the scope of the disclosure. It should be noted that those of ordinary skill in the art can further make several variations and improvements without departing from the conception of the present disclosure. These variations and improvements all fall within the protection scope of the present disclosure. Therefore, the protection scope of the present disclosure shall be subject to the protection scope defined by the claims.

The invention claimed is:

1. A method for manufacturing a semiconductor device, comprising:
    providing a substrate;
    forming a plurality of first structures extending in a first direction on the substrate;
    forming a sacrificial layer on sidewalls of the first structures, wherein an inner spacer layer locates on the top surface of the sacrificial layer;
    forming an outer spacer layer on a sidewall of the sacrificial layer and the inner spacer layer;
    forming a filling dielectric layer between the plurality of first structures through a deposition process;
    removing the filling dielectric layer above a top surface of the outer spacer layer through a polishing process, such that a top surface of the filling dielectric layer is flush with the top surface of the outer spacer layer;
    forming a mask layer and a photoresist layer on the outer spacer layer and the filling dielectric layer, exposing and developing the photoresist layer to form a patterned photoresist layer extending in a second direction, and etching the mask layer based on the patterned photoresist layer to form a patterned mask layer extending in the second direction;
    etching the outer spacer layer and the filling dielectric layer using the patterned mask layer as a mask, and removing part of the outer spacer layer and part of the filling dielectric layer to obtain a patterned outer spacer layer that exposes part of the sacrificial layer, wherein the patterned outer spacer layer comprises a plurality of outer spacer blocks, and the plurality of outer spacer blocks and air gaps are distributed on the substrate at intervals in the first direction; and
    removing the sacrificial layer to form air gaps between the patterned outer spacer layer and the first structures.

2. The method according to claim 1, wherein each of the first structures comprises a conductive structure and an isolation sidewall located on a sidewall of the conductive structure; the sacrificial layer is formed on a sidewall of the isolation sidewall away from the conductive structure.

3. The method according to claim 2, wherein the forming a sacrificial layer on sidewalls of the first structures comprises:
    forming a complete sacrificial layer on exposed surfaces of the substrate and the first structures through a deposition process; and
    etching back the completed sacrificial layer to form the sacrificial layer on the sidewalls of the first structures.

4. The method according to claim 3, wherein each of the first structures further comprises a hard mask structure on the conductive structure;
    the etching back the complete sacrificial layer to form the sacrificial layer on the sidewalls of the first structures comprises:
    performing a first etching on the complete sacrificial layer, such that a top surface of the complete sacrificial layer after the first etching is flush with a top surface of the conductive structure, or higher than the top surface of the conductive structure and lower than top surfaces of a plurality of hard mask structures;
    forming an initial inner spacer layer on the top surface of the complete sacrificial layer after the first etching and exposed surfaces of the hard mask structures through the deposition process;
    etching the initial inner spacer layer to remove part of the initial inner spacer layer on the top surface of the complete sacrificial layer after the first etching and on the top surfaces of the hard mask structures, so as to form the inner spacer layer on sidewalls of the hard mask structures; and
    performing a second etching on the complete sacrificial layer using the inner spacer layer after the first etching as a mask, so as to form the sacrificial layer on the sidewalls of the first structures.

5. The method according to claim 1, wherein the sacrificial layer comprises a hydrocarbon layer, and the removing the sacrificial layer comprises:
    removing the sacrificial layer through an ashing process.

6. The method according to claim 1, wherein the method further comprises:
    forming a plurality of second structures extending in a second direction in the substrate, wherein each of the second structure comprises a buried word line extending in the second direction and a word line protection structure formed on the buried word line.

7. The method according to claim 2, wherein the conductive structure comprises a bit line extending in the first direction; a bit line protection structure is formed on the bit line.

8. The method according to claim 3, wherein the deposition process comprises an atomic layer deposition process.

9. The method according to claim 1, wherein after the removing the sacrificial layer to obtain air gaps, the method further comprises:
    forming a plurality of storage node contact structures between the plurality of first structures, wherein the storage node contact structures are in contact with the substrate; the air gaps are located between the storage node contact structures and the first structures.

10. The method according to claim 9, wherein the forming a plurality of storage node contact structures between the plurality of first structures comprises:
   removing the filling dielectric layer;
   etching part of the substrate to form a plurality of recessed substrate contact holes between adjacent first structures;
   forming an epitaxial layer on the substrate through an epitaxial process, wherein the epitaxial layer at least fills up the substrate contact holes; and
   etching back the epitaxial layer to form the plurality of storage node contact structures, wherein top surfaces of the storage node contact structures are lower than top surfaces of the first structures.

11. The method according to claim 10, wherein before the removing the filling dielectric layer, the forming the plurality of storage node contact structures further comprises:
   forming a node spacer layer in the filling dielectric layer through the deposition process, the node spacer layer covering the top surface of the filling dielectric layer; and
   etching back the node spacer layer such that a top surface of the node spacer layer is flush with the top surface of the filling dielectric layer.

12. The method according to claim 10, wherein after the etching back the epitaxial layer, the method further comprises:
   etching the patterned outer spacer layer to turn a top surface of the patterned outer spacer layer into an inclined surface.

13. A semiconductor device, comprising:
   a substrate;
   a plurality of first structures formed on the substrate and extending in a first direction; and
   a patterned outer spacer layer formed on partial regions on two sidewalls of the first structures, wherein air gaps are formed between the patterned outer spacer layer and the first structures;
   wherein, the patterned outer spacer layer comprises a plurality of outer spacer blocks; the plurality of outer spacer blocks and air gaps are distributed on the substrate at intervals in the first direction;
   each of the first structures comprises a conductive structure and an isolation sidewall located on a sidewall of the conductive structure; the air gaps are formed between the isolation sidewalls and the patterned outer spacer layer; and
   an inner spacer layer is further provided between the patterned outer spacer layer and the first structures, the inner spacer layer defines a top surface of the air gaps, the air gaps are located between the inner spacer layer and the substrate, and the top surface of the air gaps is flush with a top surface of each conductive structure, or higher than the top surface of each conductive structure.

14. The semiconductor device according to claim 13, wherein the semiconductor device further comprises:
   a plurality of storage node contact structures formed between the plurality of first structures, wherein the storage node contact structures are in contact with the substrate; the air gaps are located between the storage node contact structures and the first structures.

15. The semiconductor device according to claim 14, wherein a top surface of the patterned outer spacer layer is an inclined surface.

16. The semiconductor device according to claim 13, wherein the conductive structure comprises a bit line extending in the first direction; a bit line protection structure is formed on the bit line.

17. The semiconductor device according to claim 13, wherein the semiconductor device further comprises:
   a plurality of second structures formed in the substrate and extending in a second direction; each of the second structures comprises a buried word line extending in the second direction and a word line protection structure formed on the buried word line.

18. The semiconductor device according to claim 16, wherein the top surface of the air gaps is lower than a top surface of each bit line protection structure.

* * * * *